(12) United States Patent
Agarwal et al.

(10) Patent No.: US 9,362,131 B2
(45) Date of Patent: Jun. 7, 2016

(54) FAST ATOMIC LAYER ETCH PROCESS USING AN ELECTRON BEAM

(71) Applicant: APPLIED MATERIALS, INC., Santa Clara, CA (US)

(72) Inventors: Ankur Agarwal, Fremont, CA (US); Shahid Rauf, Pleasanton, CA (US); Kartik Ramaswamy, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 14/505,168

(22) Filed: Oct. 2, 2014

(65) Prior Publication Data
US 2016/0064231 A1     Mar. 3, 2016

Related U.S. Application Data

(60) Provisional application No. 62/043,619, filed on Aug. 29, 2014.

(51) Int. Cl.
| | | |
|---|---|---|
| *H01L 21/3065* | (2006.01) | |
| *H01L 21/306* | (2006.01) | |
| *H01L 21/311* | (2006.01) | |
| *H01L 21/3213* | (2006.01) | |
| *B81C 1/00* | (2006.01) | |

(52) U.S. Cl.
CPC ...... *H01L 21/30655* (2013.01); *B81C 1/00531* (2013.01); *H01L 21/3065* (2013.01); *H01L 21/30621* (2013.01); *H01L 21/31111* (2013.01); *H01L 21/31116* (2013.01); *H01L 21/32135* (2013.01)

(58) Field of Classification Search
None
See application file for complete search history.

(56) References Cited

U.S. PATENT DOCUMENTS

| | | | |
|---|---|---|---|
| 7,416,989 B1 | 8/2008 | Liu et al. | |
| 2007/0163994 A1 | 7/2007 | Rauf et al. | |
| 2010/0193781 A1 | 8/2010 | Tripathy et al. | |
| 2011/0139748 A1* | 6/2011 | Donnelly | H01J 37/32036 216/37 |

OTHER PUBLICATIONS

A. Agarwal and M.J. Kushner, "Plasma Atmoic Layer Etching Using Conventional Plasma Equipment", Journal of Vacuum Science and Technology, vol. A27, year 2009, pp. 37-50.*
U.S. Patent Application as filed Oct. 2, 2014 in Co-Pending U.S. Appl. No. 14/505,148.
Official Action Dated Aug. 13, 2015 Issued in Co-Pending U.S. Appl. No. 14/505,148.
Official Action dated Feb. 11, 2016 Issued in Co-Pending U.S. Appl. No. 14/505,148.

* cited by examiner

*Primary Examiner* — Jiong-Ping Lu
(74) *Attorney, Agent, or Firm* — Robert M. Wallace

(57) ABSTRACT

An etch process gas is provided to a main process chamber having an electron beam plasma source, and during periodic passivation operations a remote plasma source provides passivation species to the main process chamber while ion energy is limited below an etch ion energy threshold. During periodic etch operations, flow from the remote plasma source is halted and ion energy is set above the etch threshold.

20 Claims, 7 Drawing Sheets

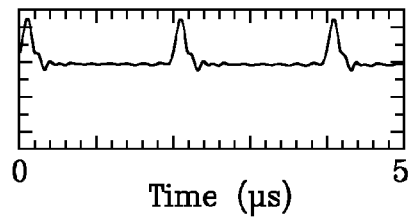
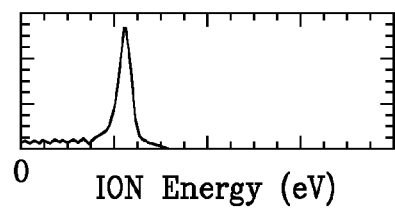
FIG. 7A    FIG. 7B
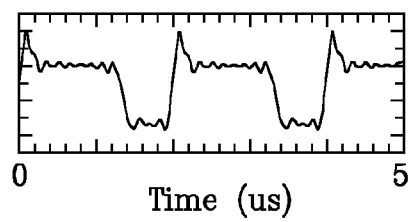
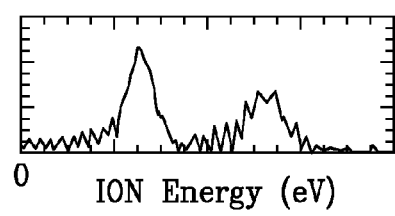
FIG. 8A    FIG. 8B
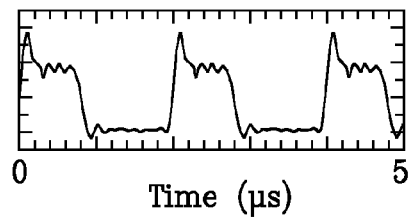
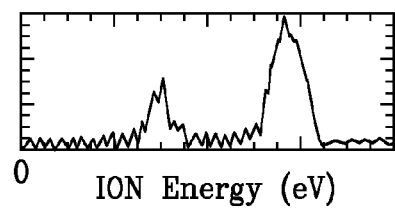
FIG. 9A    FIG. 9B
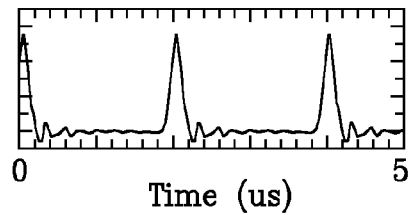
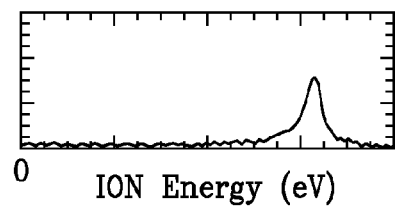
FIG. 10A    FIG. 10B

FAST ATOMIC LAYER ETCH PROCESS USING AN ELECTRON BEAM

CROSS-REFERENCE TO RELATED APPLICATIONS

This application claims benefit of U.S. Provisional Application Ser. No. 62/043,619 filed Aug. 29, 2014 entitled FAST ATOMIC LAYER ETCH PROCESS USING AN ELECTRON BEAM AND A SINGLE PROCESS GAS, by Ankur Agarwal, et al.

BACKGROUND

1. Technical Field

The disclosure concerns a plasma-enhanced reactive ion etch (PERIE) process for a workpiece such as a semiconductor wafer.

2. Background Discussion

In conventional atomic layer etching, a PERIE process removes an overlying layer (e.g., silicon dioxide) formed on a base layer (e.g., Silicon). The removal is performed one atomic layer at a time, as follows: The top atomic layer is passivated by a exposing it to a passivating process gas for the amount of time required for just one atomic layer to react with the passivating process gas, leaving underlying atomic layers unchanged. The one atomic layer that has been thus passivated may be referred to as the passivated layer. Species from the passivating process gas are chemically bound with material in the passivated layer, altering its characteristics. The passivated layer is susceptible to etching by a particular etch species, while the underlying layers remain impervious to the particular etch species. Upon completion of the passivation of a single atomic layer, the passivation process gas is removed for example by purging the processing chamber. The passivated layer is then etched by introducing a different process gas containing the particular etch species. Upon completion of the etch operation, the chamber is again purged. The foregoing operations of passivation and etching, including the change or purging of process gases, are then repeated for the next atomic layer. The cycle is continued until all atomic layers have been removed. One problem with this conventional process is that the purging and changing of process gases is time consuming, and must be performed for each atomic layer. Given the large number of atomic layers within the thickness of a typical silicon dioxide layer, the entire process is very time-consuming.

SUMMARY

A method is provided for removing from a workpiece a succession of layers of an overlying film of a first material formed on a base surface of a second material in a reactor chamber. In one embodiment, the method comprises providing an electron beam in the chamber, coupling an RF bias voltage to the workpiece, introducing a process gas into the chamber and supplying a passivating gas to a remote plasma source, and performing a passivation process for a time duration corresponding to a desired thickness of a layer of the first material to be passivated. The passivation process in one embodiment comprises enabling flow of plasma by-products from the remote plasma source to the reactor chamber, setting energy of ions in the chamber to a first ion energy level less than a first minimum ion energy required for etching the overlying film, and after the time duration, halting the passivation process and performing an etching process by setting energy of ions in the chamber to a second ion energy level exceeding the first minimum ion energy.

In one embodiment, the second ion energy level is less than a second minimum ion energy required to etch the second material. In one embodiment, the desired thickness is one atomic layer of the material. In one embodiment, the passivation process is performed for a time duration sufficiently short to limit thickness of the layer to one atomic layer. In one embodiment, halting the passivation process comprises stopping the flow of plasma by-products from the remote plasma source to the reactor chamber.

In one embodiment, the passivating gas contains Chlorine and the process gas is an etch process gas comprising a fluorocarbon. In one embodiment, the first material is Silicon dioxide and the second material is crystalline Silicon.

In one embodiment the setting of ion energy to a first ion energy level comprises tailoring a time domain waveform of the RF bias voltage to an RF waveform in which the RF voltage is at a level corresponding to the first ion energy level for a duration of at least 50% of an RF cycle of the RF waveform.

In one embodiment, the setting of ion energy to a second ion energy level comprises tailoring a time domain waveform of the RF bias voltage to an RF waveform in which the RF voltage is at a level corresponding to the second ion energy level for a duration of at least 50% of an RF cycle of the RF waveform.

In accordance with a further aspect, a method is provided for performing atomic layer etching of an overlying film of a first material formed on a base surface of a second material of a workpiece in a reactor chamber. The method comprises directing an electron beam into the chamber, coupling an RF bias voltage to the workpiece, supplying a passivating process gas to a remote plasma source, passivating a predetermined thickness of a layer of the first material by enabling flow of plasma by-products to the reactor chamber and then disabling the flow of plasma by-products to the reactor chamber, etching the layer, during the passivating, setting energy of ions in the chamber to a first ion energy level less than a first minimum ion energy for etching the layer by tailoring a time domain waveform of the RF bias voltage in accordance with the first ion energy level, during the etching, setting energy of ions in the chamber to a second ion energy level exceeding the first minimum ion energy by tailoring a time domain waveform of the RF bias voltage in accordance with the second ion energy level.

In one embodiment, the method further comprises limiting the passivating to a time duration corresponding to the predetermined thickness. In one embodiment, the predetermined thickness corresponds to a predetermined number of atomic layers of the layer. The predetermined thickness corresponds to a single atomic layer of the layer, in one embodiment.

In one embodiment, the method further comprises repeating the passivating and etching in successive operations until removal of the overlying film of the first material is complete.

In one embodiment, during the passivating, the tailoring comprises conforming a time domain waveform of the RF bias voltage to a shape that produces an ion energy distribution function having a population peak at the first ion energy level. In one embodiment, during the etching, the tailoring comprises conforming a time domain waveform of the RF bias voltage to a shape that produces an ion energy distribution function having a population peak at the first ion energy level.

In accordance with a further aspect, a method is provided for performing atomic layer etching on a workpiece in alternating operations of passivating and etching in a reactor chamber. This method comprises: (A) during the passivating, enabling a flow to the chamber of plasma by-products comprising passivation species from a remote plasma source, and tailoring RF bias power to a waveform in which RF voltage is at a level corresponding to a first ion energy level less than an etch threshold of a deposited layer on the workpiece for a duration of at least 50% of an RF cycle of the waveform; and (B) during the etching, halting the flow and tailoring RF bias power to a waveform in which RF voltage is at a level corresponding to a second ion energy level exceeding an etch threshold of a deposited layer on the workpiece for a duration of at least 50% of an RF cycle of the waveform.

BRIEF DESCRIPTION OF THE DRAWINGS

So that the manner in which the exemplary embodiments of the present invention are attained can be understood in detail, a more particular description of the invention, briefly summarized above, may be had by reference to the embodiments thereof which are illustrated in the appended drawings. It is to be appreciated that certain well known processes are not discussed herein in order to not obscure the invention.

FIG. 7A is a graph depicting a tailored time domain waveform of RF bias voltage applied to the workpiece.

FIG. 7B depicts an ion energy distribution function produced by the waveform of FIG. 7A.

FIG. 8A is a graph depicting a tailored time domain waveform of RF bias voltage applied to the workpiece.

FIG. 8B depicts an ion energy distribution function produced by the waveform of FIG. 8A.

FIG. 9A is a graph depicting a tailored time domain waveform of RF bias voltage applied to the workpiece.

FIG. 9B depicts an ion energy distribution function produced by the waveform of FIG. 9A.

FIG. 10A is a graph depicting a tailored time domain waveform of RF bias voltage applied to the workpiece.

FIG. 10B depicts an ion energy distribution function produced by the waveform of FIG. 10A.

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this invention and are therefore not to be considered limiting of its scope, for the invention may admit to other equally effective embodiments.

DETAILED DESCRIPTION

Figure 1:
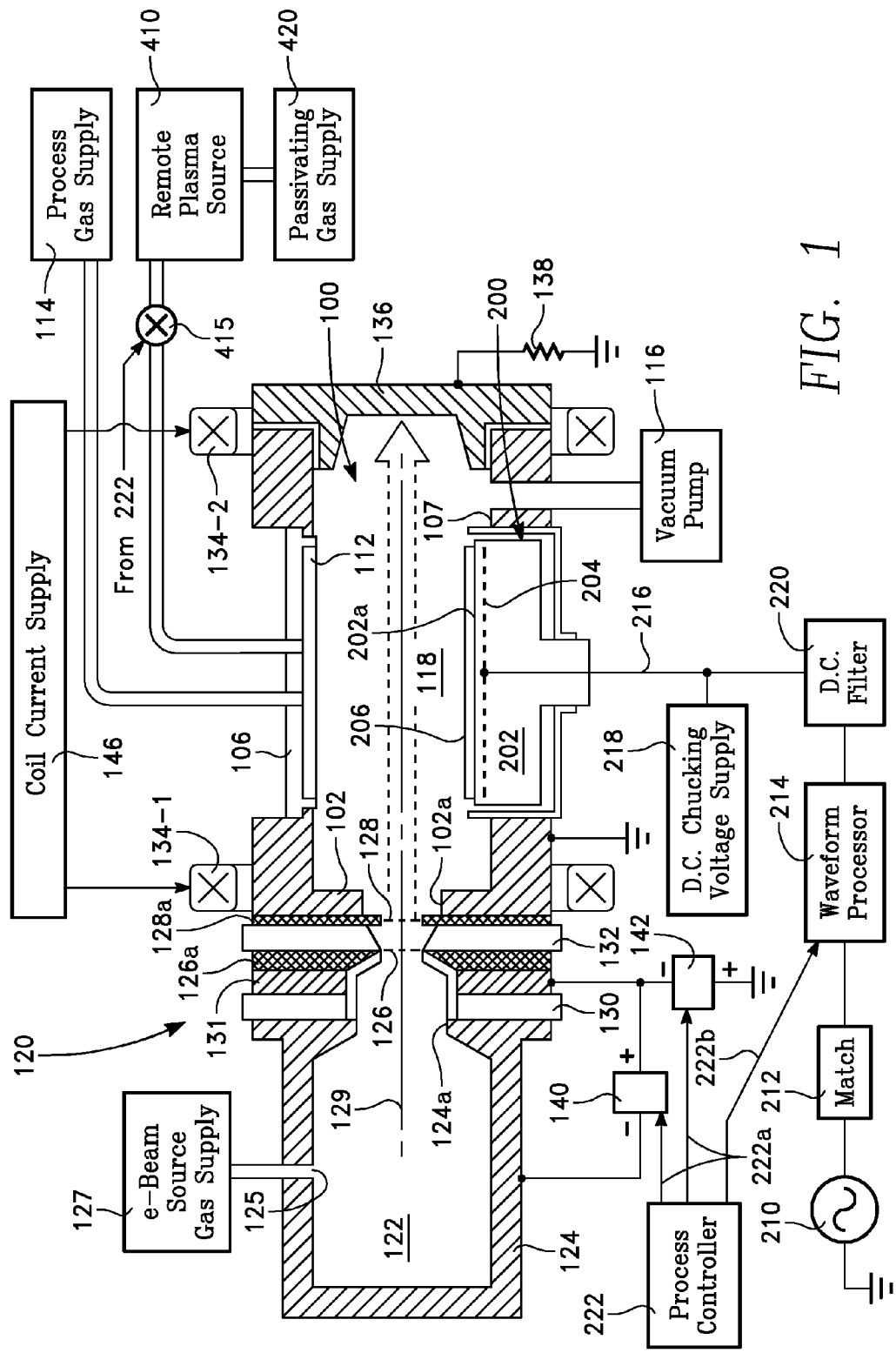
FIG. 1 depicts a cross-sectional side view of a first embodiment of a plasma reactor.

Referring to FIG. 1, a plasma reactor has an electron beam generator as a plasma source. The reactor includes a processing chamber 100 enclosed by a cylindrical side wall 102, a floor 107 and a ceiling 106. A workpiece support pedestal 200 includes a puck 202 having a support surface 202a which supports a workpiece 206, such as a semiconductor wafer, the workpiece support pedestal 200 being movable in the axial (e.g., vertical) direction. A gas distribution plate 112 is integrated with or mounted on the ceiling 106, and receives process gas from a process gas supply 114. A remote plasma source (RPS) 410 is coupled to the chamber 100. In the illustrated embodiment, the RPS is coupled to the gas distribution plate 112 through a valve 415. An RPS gas supply 420 is coupled to the RPS 410 and may contain precursors of radical species capable of passivating a material such as Silicon dioxide. A vacuum pump 116 evacuates the processing chamber 100 through a passage in the floor 107. A processing region 118 is defined between the workpiece support pedestal 200 and the gas distribution plate 112. Within the processing region 118, the process gas is ionized to produce a plasma for processing of the workpiece 206. The plasma is generated in the processing region 118 by an electron beam from an electron beam source 120. The plasma is characterized by a low electron temperature (e.g., <1.5 ev) and a correspondingly low ion energy.

An electrode 204 within the puck 202 underlies the support surface 202a. An RF bias power generator 210 is coupled through an impedance match 212 and through a waveform tailoring processor 214 to the electrode 204 via a center conductor 216 extending through the workpiece support pedestal 200. In one embodiment, a D.C. chucking voltage supply 218 may be connected to the center conductor 216, and a D.C. blocking filter 220 may be provided between the waveform tailoring processor 214 and the D.C. chucking voltage supply 218.

The controller 222 has an ion energy control output 222b coupled to the waveform tailoring processor 214 to control ion energy at the surface of the workpiece 206. As will be explained later in this specification, the ion energy is controlled through the waveform tailoring processor 214 by governing the waveform of the RF bias power (voltage or current) applied to the electrode 204.

The reactor of FIG. 1 is useful for performing atomic layer etch processes (or atomic layer deposition processes). In such a process, the layer to be etched (e.g., Silicon dioxide) is removed one atomic layer at a time without etching the underlying layer (e.g., a silicon substrate).

In the conventional version of such a process, a conventional plasma reactor is employed (not the reactor of FIG. 1), and the top atomic layer is passivated by a exposing it to a passivating process gas for the amount of time required for just one atomic layer to react with the passivating process gas, leaving underlying atomic layers unchanged. The one atomic layer that has been thus passivated may be referred to as the passivated layer. Thereafter, the chamber is purged to remove process gases.

Species from the passivating process gas are chemically bound with material in the passivated layer, altering its characteristics. The passivated layer is susceptible to etching by a particular etch species, while the underlying layers remain impervious to the particular etch species. The passivated layer is etched by exposing the workpiece to a process gas containing the particular etch species. The foregoing operations of passivation and etching, including the change of process gases, are then repeated for the next atomic layer. The cycle is continued until all atomic layers have been removed to expose the base layer. One problem with this conventional process is that the changing of process gases is time consuming, and must be performed for each atomic layer. Given the large number of atomic layers within the thickness of a typical silicon dioxide layer, the entire process is extremely time-consuming.

Embodiments disclosed herein perform atomic layer etching using the reactor of FIG. 1 without purging the process gas in the chamber and without removing the workpiece from the process chamber.

The layer to be etched may be Silicon dioxide or other dielectric material, such as Silicon nitride. Throughout the entire process, an etching process gas suitable for etching the dielectric material is continuously fed into the chamber. Such an etching process gas may be a combination of a fluorocarbon gas, oxygen and argon. The fluorocarbon may be for example, C4F8, CHF3, CH2F2, CF4 or the like. During the passivation operation, the RPS 410 is activated (e.g., by turning on the valve 415) in order to provide dissociated species (e.g., chlorine or chlorine-containing species) that passivate the deposited layer. Also, the ion energy at the workpiece surface is set below an ion energy level less than the threshold for etching of the passivated layer. This suppresses or prevents etching during the passivation operation.

During the etching operation, the RPS 410 is deactivated (e.g., by turning off the valve 415). Also, the ion energy at the workpiece surface is set above the threshold for etching the passivated material but less than the threshold for etching the base layer.

In each operation, a narrow or sharp ion energy distribution at the desired ion energy is obtained by tailoring or shaping the waveform of the RF bias voltage (or current) on the electrode 204. The waveform tailoring is performed by the waveform tailoring processor 214. During the passivation operation, the waveform is set to a tailored shape at which the ion energy is narrowly distributed below the etch threshold referred to above. During the etching operation, the waveform is set to a tailored shape at which the ion energy is narrowly distributed above the etch threshold referred to above but below the etch threshold of the base layer. The ion energy distributions obtained by such waveform tailoring are extremely narrow. As a result, during passivation, effectively no ions (or only a negligible number of ions) have energies exceeding the etch threshold. Moreover, during etching, effectively no ions (or only a negligible number of ions) have energies below the etch threshold of the passivated material or above the etch threshold of the base layer. An advantage is that the atomic layer etch process is much more precise.

Figure 2:
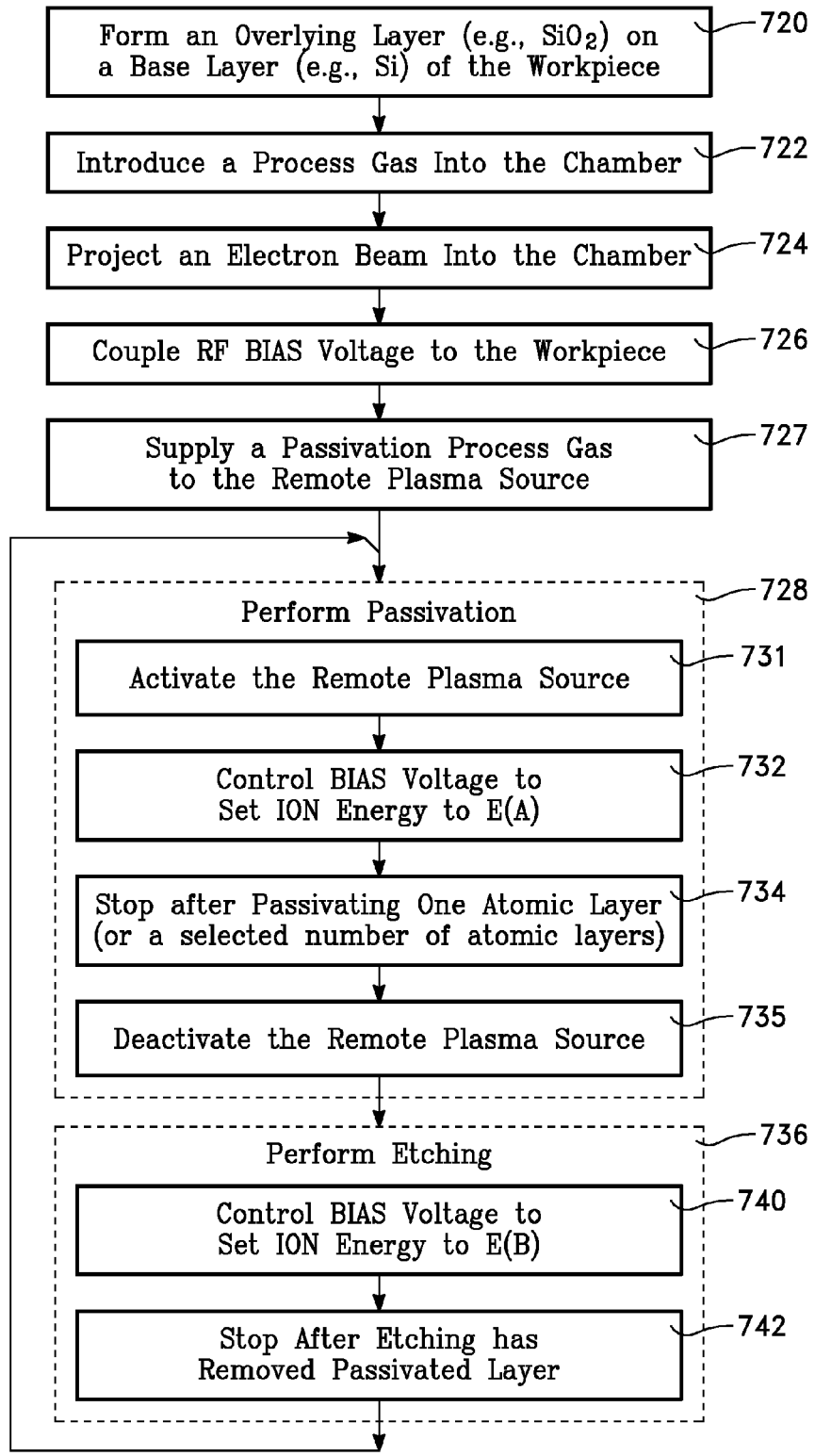
FIG. 2 is a block flow diagram of a process performed by the reactor of FIG. 1.

Referring now to FIG. 2, the process begins after deposition or formation of a layer to be etched (e.g., silicon dioxide) on a base layer (e.g., silicon) of a workpiece or wafer (block 720 of FIG. 2). The workpiece is placed in the chamber of an etch process reactor and a process gas is introduced into the chamber (block 722 of FIG. 2). An electron beam is directed into a process region of the chamber (block 724 of FIG. 2). An RF bias voltage is coupled to the workpiece (block 726). A process gas containing precursors of a passivation species (e.g., Cl) is introduced into the remote plasma source 410 (block 727). Then, the top-most atomic layer of the deposited layer is passivated (block 728). This passivation operation consists of the following operations: activate the RPS 410 (block 731), e.g., by opening the valve 415; set the ion energy at the workpiece surface to a level E(A) below the etch threshold of the material to be etched (block 732). (This etch threshold corresponds to the characteristics of the material after being passivated.) Then, upon the passivation reaching the bottom of the top atomic layer of the deposited material, halt the passivation operation (block 734) and deactivate the RPS 410 (block 735), e.g., by closing the valve 415. The etching operation is then begun (block 736). The etching operation includes the following operations: set the ion energy at the workpiece surface to a level E(B) above the etch threshold of the deposited material and below the etch threshold of the base layer (block 740). Then, upon etching through to the bottom of the top atomic layer of the deposited material, halt the etch operation (block 742) and repeat the entire process, starting with the passivation operation (block 728).

Figures 2A, 2B, 2C:
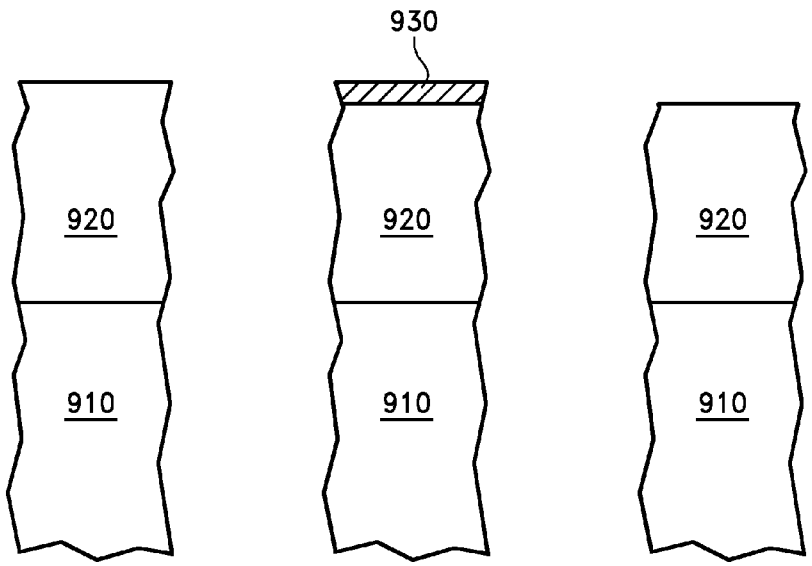
FIGS. 2A, 2B and 2C are chronologically successive side views of a workpiece and depict a sequence of changes in the structure of the workpiece during a single cycle of the process of FIG. 2.

FIGS. 2A, 2B and 2C depict a sequence of changes in the structure of the workpiece during a single cycle of the process of FIG. 2. FIG. 2A depicts the workpiece including a substrate or base layer 910 (e.g., a Silicon layer) and an overlying deposited layer 920, which may be Silicon dioxide. In FIG. 2B, a top atomic layer 930 of the deposited layer 920 has been passivated. In FIG. 2C, the top atomic layer 930 has been removed by etching.

Figure 3:
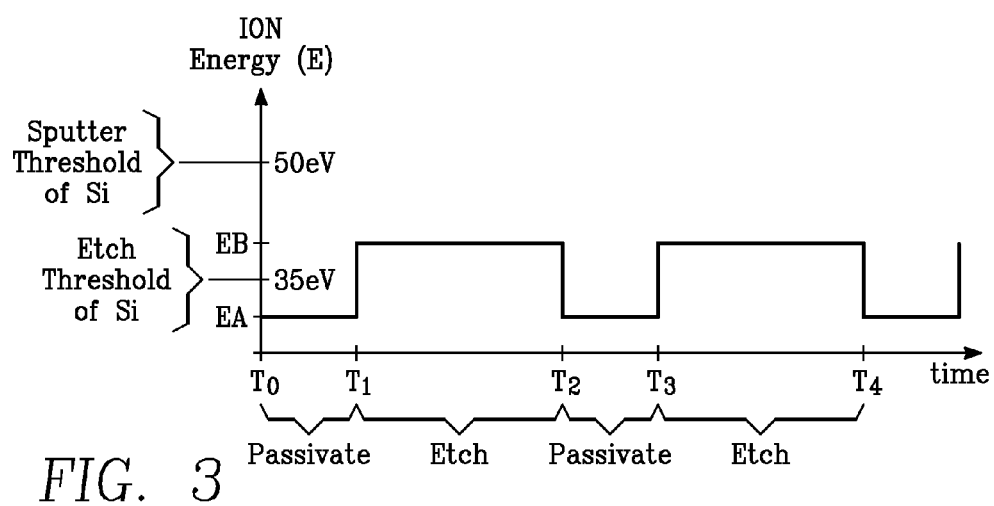
FIG. 3 is a timing diagram depicting the ion energy as a function of time in the process of FIG. 2.
Figure 4:
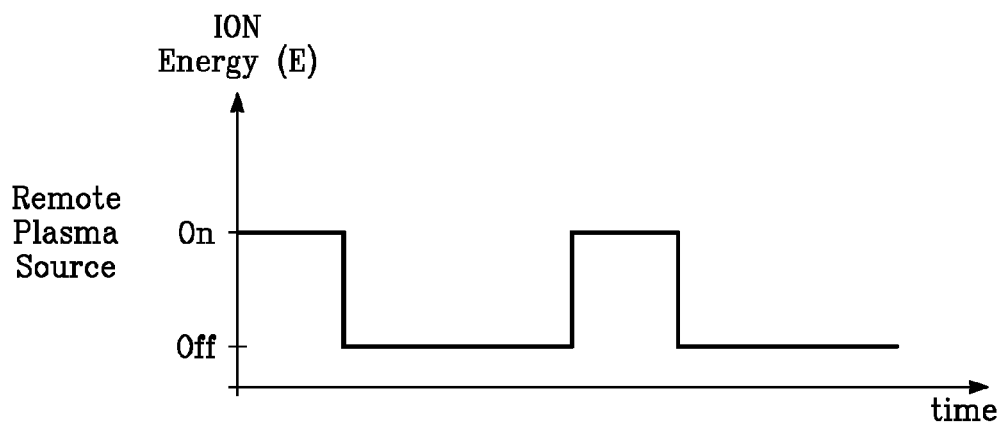
FIG. 4 is a timing diagram contemporaneous with FIG. 3 depicting operation of a plasma source in the reactor of FIG. 1.
Figure 5:
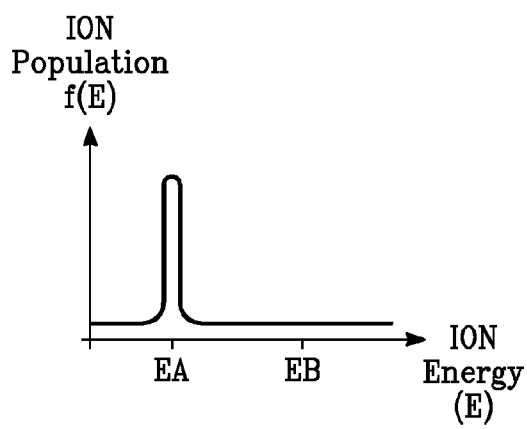
FIGS. 5 and 6 depict ion energy distribution functions during different periods of the process of FIGS. 2 and 3.
Figure 6:
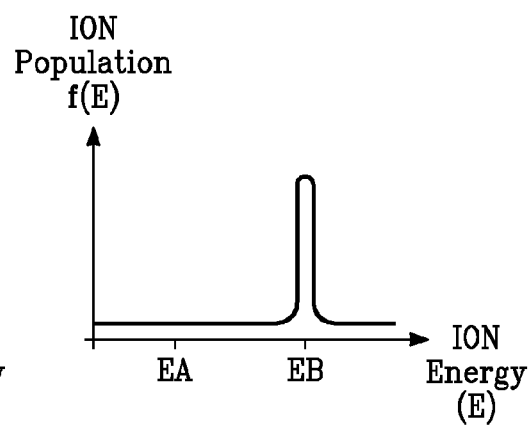

FIG. 3 illustrates the ion energy selection as a function of time in the process of FIG. 2. This selection is facilitated by the waveform tailoring processor 214. FIG. 4 depicts activation and deactivation of the RPS 410 as a function of time. From time T0 to time T1, the RPS 410 is activated (e.g., flow from the RPS 410 is enabled) and the passivation operation is performed, during which the ion energy is selected to be EA, which is below the etch threshold of the passivated layer. The corresponding ion energy distribution function is depicted in FIG. 5. In one example of a passivated silicon dioxide layer, the etch threshold of the passivated material is about 35 ev. From time T1 to time T2, the RPS 410 is deactivated and the etch operation is performed, during which the ion energy is selected to be EB, which is above the etch threshold of the passivated layer but below the etch threshold of the base layer. The corresponding ion energy distribution function is depicted in FIG. 6. If the base layer is silicon, then the etch threshold of the base layer is about 50 ev. Thus, in this example, EB is a value between 35 ev and 50 ev.

FIGS. 7A, 8A, 9A and 10A depict different time domain tailored waveforms of RF bias voltage (or current) provided by the waveform tailoring processor 214. FIGS. 7B, 8B, 9B and 10B depict ion energy distribution functions produced by corresponding ones of the waveforms of FIGS. 7A, 8A, 9A and 10A. The waveform of FIG. 7A produces a single narrow ion energy distribution peak at a lower ion energy as shown in FIG. 7B, while the waveform of FIG. 10A produces a single narrow ion energy distribution peak at a higher ion energy as shown in FIG. 10B. Thus, selecting different ion energy levels is performed by selecting different tailored waveforms of the RF bias voltage. In one embodiment, the controller 222 selects a particular tailored waveform that produces an ion energy distribution having a single peak at the desired ion energy level.

Figure 11:
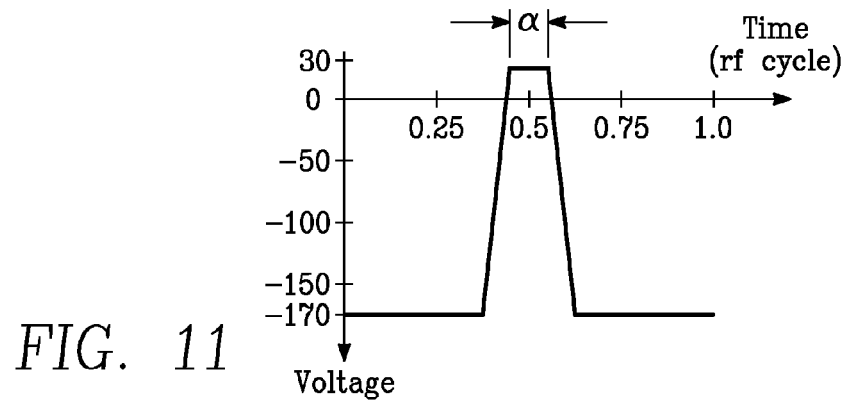
FIG. 11 depicts another time domain waveform of RF bias voltage in an alternative embodiment.

FIG. 11 depicts a time domain waveform of RF bias voltage which may be tailored by varying the width of a peak labeled "α" in FIG. 11. Varying the width of α changes the center energy level of the ion energy distribution.

One implementation of the electron beam source 120 is depicted in FIG. 1, although any suitable design may be employed in carrying out embodiments described herein. The electron beam source 120 of FIG. 1 includes a plasma generation chamber 122 spaced from the processing chamber 100 and having a conductive (or partially conductive) enclosure 124. The conductive enclosure 124 has a gas inlet 125. An electron beam source gas supply 127 is coupled to the gas inlet 125. The conductive enclosure 124 has an opening 124a facing the processing region 118 through an opening 102a in the side wall 102 of the processing chamber 100.

The electron beam source 120, in one embodiment, includes an extraction grid 126 adjacent the opening 124a and the plasma generation chamber 122, and an acceleration grid 128 adjacent the extraction grid 126 and facing the processing region 118. The extraction grid 126 and the acceleration grid 128 may each be formed as either a conductive mesh or a slotted electrode, for example, and are herein referred to generically as grids. Electrical contact to the extraction grid 126 is provided by a conductive ring 126a surrounding the extraction grid. Electrical contact to the acceleration grid 128 is provided by a conductive ring 128a surrounding the acceleration grid 128. The extraction grid 126 and the acceleration grid 128 are mounted with insulators 130, 132, respectively, so as to be electrically insulated from one another and from the conductive enclosure 124. However, the acceleration grid 128 is in electrical contact with the side wall 102 of the chamber 100. The openings 124a and 102a and the extraction and acceleration grids 126, 128 are mutually congruent, generally, and define a thin wide flow path for an electron beam into the processing region 118. The width of the flow path is about the diameter of the workpiece 206 (e.g., 100-400 mm) while the height of the flow path is less than about two inches. The flow path of the electron beam is generally parallel to an in-chamber beam axis 129 that is generally parallel with the ceiling 106 and generally parallel with a plane of the workpiece 206.

A pair of electromagnets 134-1 and 134-2 are adjacent opposite ends of the chamber 100, the electromagnet 134-1 being near the electron beam source 120. The two electromagnets 134-1 and 134-2 produce a magnetic field parallel to the electron beam path along the in-chamber beam axis 129. The electron beam flows across the processing region 118 over the workpiece 206, and is absorbed at the opposite end of the processing region 118 by a beam dump 136. The beam dump 136 is a conductive body having a shape adapted to capture the wide thin electron beam. The beam dump 136 may be coupled to ground through a shunt resistor 138.

The electron beam source 120 may produce plasma within the plasma generation chamber 122 by a power source coupled to a source power applicator in or adjacent the plasma generation chamber 122. The density of plasma produced by the electron beam in the processing region 118 may be controlled by controlling the power level of the power source or the electron beam source, for example. Alternatively or in addition, the plasma density in the processing region 118 may be controlled by controlling the gas flow rate from the electron beam source gas supply 127 to the gas inlet 125.

In one embodiment, the electron beam source 120 is an inductively coupled plasma source, in which case the source power applicator is a coil antenna and the power source is an RF power generator. In another embodiment, the electron beam source 120 is a capacitively coupled plasma source, in which case the source power applicator is an electrode or a wall of the plasma generation chamber 122 and the power source is an RF power generator. Alternatively, the electron beam source 120 may be a microwave plasma source. In yet another embodiment, the electron beam source 120 is a D.C. discharge plasma source, in which case the source power applicator is a wall of the plasma generation chamber 122 and the power source is a D.C. discharge voltage supply 140. It is this latter embodiment that is depicted in the drawings of FIG. 1.

A negative terminal of the D.C. discharge voltage supply 140 is coupled to the conductive enclosure 124, and a positive terminal of the D.C. discharge voltage supply 140 is coupled to the extraction grid 126. In turn, a negative terminal of an electron beam acceleration voltage supply 142 is coupled to the extraction grid 126, and a positive terminal of the acceleration voltage supply 142 is connected to ground. In one embodiment the acceleration grid 128 is grounded. The acceleration voltage supply 142 is connected between the extraction grid 126 and the acceleration grid 128. A coil current supply 146 is coupled to the electromagnets 134-1 and 134-2. Electrons are extracted from the plasma in the plasma generation chamber 122 through the extraction grid 126 and the acceleration grid 128 to produce an electron beam that flows into the processing chamber 100. Electrons are accelerated to energies corresponding to the voltage provided by the acceleration voltage supply 142.

A chiller plate 131 may be interposed between the ceramic insulator 130 and the extraction grid 126. The chiller plate 131 may be metallic and include internal coolant flow passages (not illustrated). In one embodiment, the chiller plate 131 contacts the extraction grid 126, and the discharge voltage supply 140 and the acceleration voltage supply 142 may be coupled to the extraction grid 126 by connection to the chiller plate 131, as shown in FIG. 1.

Figure 12:
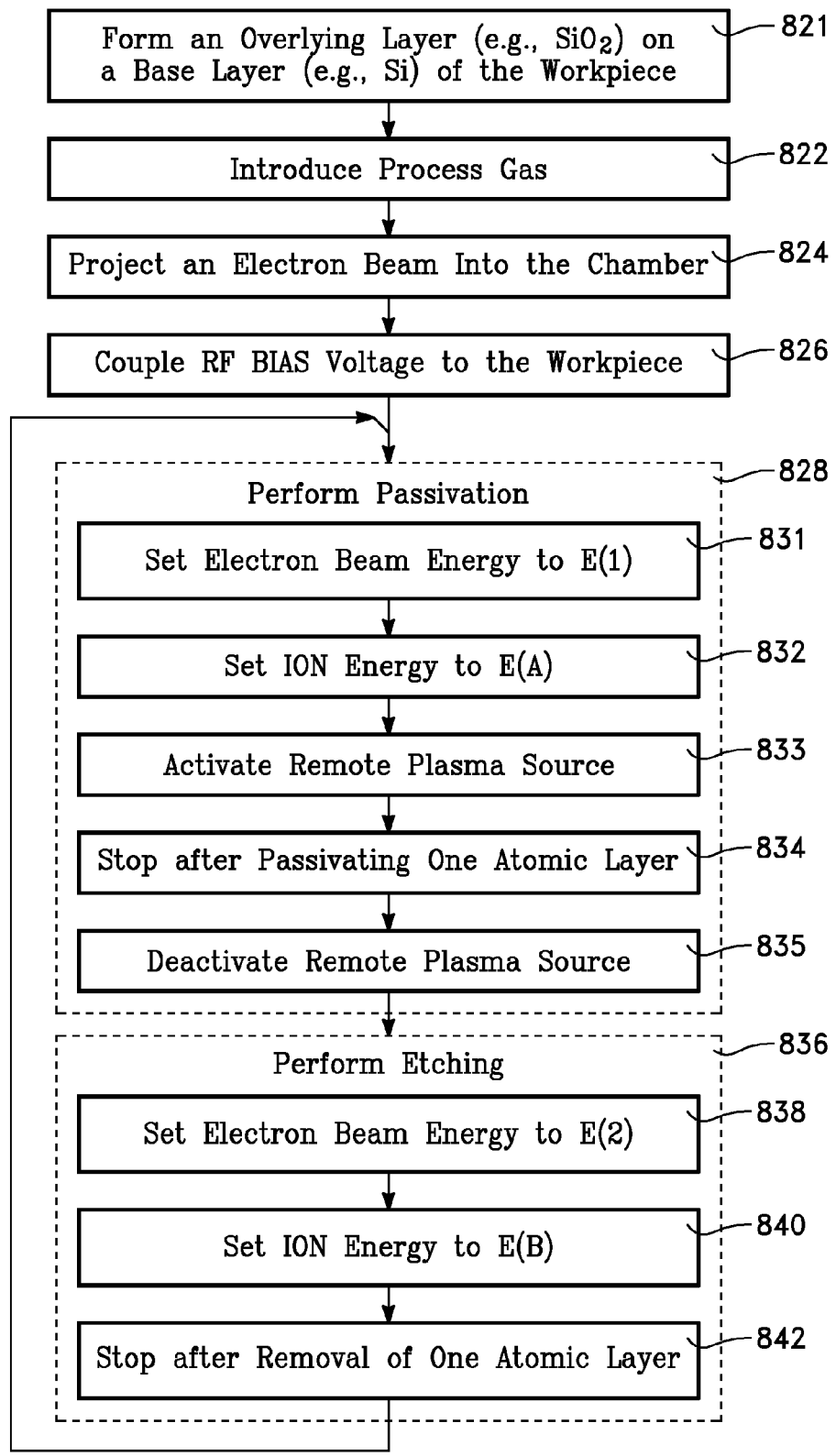
FIG. 12 is a block flow diagram of a modification of the process of FIG. 2 in which electron beam energy is controlled.

FIG. 12 depicts an alternative embodiment, in which the etch and passivation operations are enhanced by controlling the energy of the electron beam produced by the electron beam source 120. During the passivation operation, the electron beam energy is set to a predetermined level at which radical and ion species that passivate the material to be removed are produced by dissociation and ionization of the process gas by the electron beam. Then, during the etching operation, the electron beam energy is set to another predetermined level at which radical and ion species that etch the passivated material are produced by dissociation and/or ionization of the process gas by the electron beam. A detailed discussion of FIG. 12 is given later in this specification.

Figure 13:
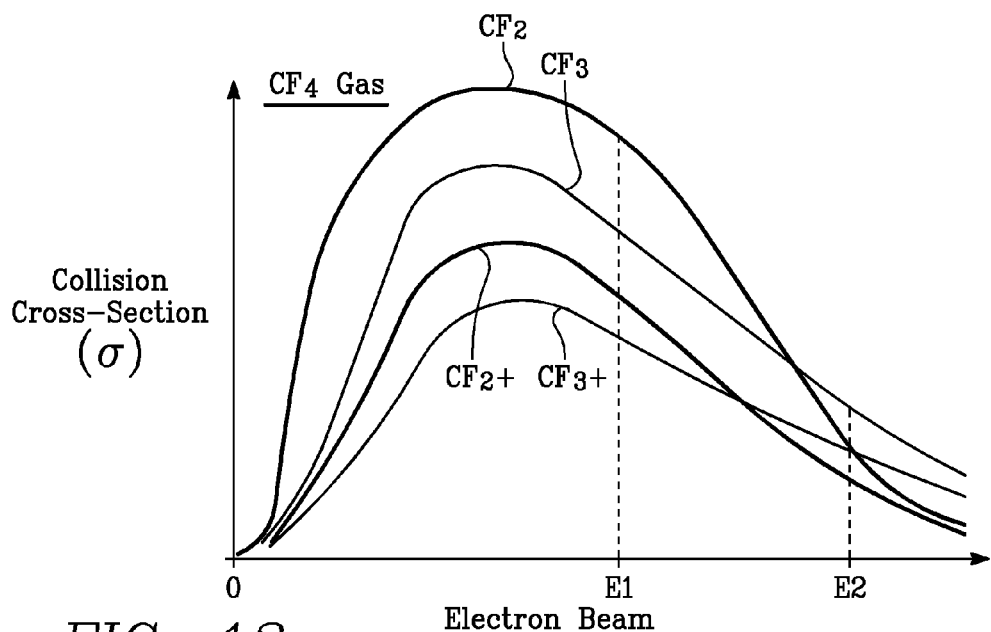
FIG. 13 is a graph qualitatively depicting collision cross-sections as a function of electron beam energy for different plasma by-products of the process gas.

FIG. 13 illustrates how to select the electron beam energy levels E1 and E2 of the passivation and etching operations respectively. FIG. 13 qualitatively depicts collision cross sections for ionization and dissociation products of a process gas as a function of electron beam energy. In the example of FIG. 13, the process gas is CF4. The dissociation products of interest are CF3 and CF2, while the ionization products of interest are CF3+ and CF2+. The species CF3 and CF3+ perform passivation of Silicon dioxide. The species CF2 and CF2+ perform etching of Silicon dioxide that has been passivated. FIG. 13 shows that at an electron beam energy of E1, the collision cross-section of CF3 exceeds that of CF2 while the collision cross-section of CF3+ exceeds that of CF2+. Thus, at an ion beam energy of E1, the passivation species dominates, and E1 is a good choice for electron beam energy during passivation. FIG. 13 further shows that at an electron beam energy of E2, the collision cross-section of CF2 exceeds that of CF3 while the collision cross-section of CF2+ exceeds that of CF3+. Thus, at an ion beam energy of E1, the etching species dominate, and E2 is a good choice for electron beam energy during etching.

Figure 14:
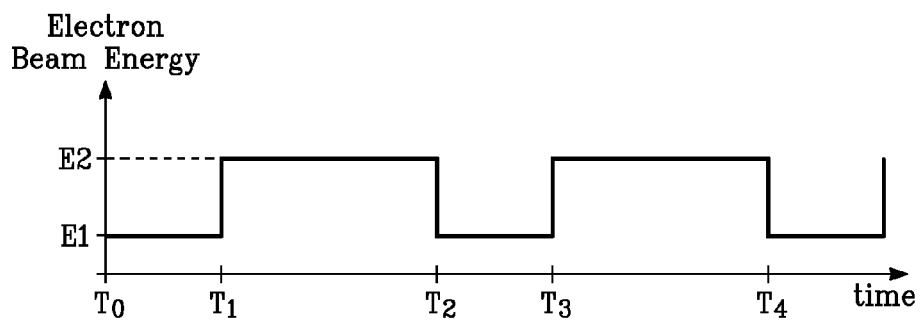
FIG. 14 is a timing diagram depicting electron beam energy as a function of time in the process of FIG. 12.

FIG. 14 depicts the controlling of electron beam energy as a function of time. During the passivation operation, from time T0 to time T1, the electron beam energy is set to E1. During the etching operation, from time T1 to time T2, the electron beam energy is set to E2.

Referring to FIG. 1, in one embodiment, the process controller 222 has an electron beam energy control output 222a coupled to the electron beam source 120 to control electron beam energy level. In one implementation, the electron beam energy control output 222a governs the output voltage level of a voltage supply of the electron beam source 120. As described above in this specification, choice of chemical species of radicals and ions in the process region 118 is controlled by governing the electron energy of the electron beam produced by the electron beam source 120.

In order for the controller 222 to govern the electron energy of the electron beam produced by the electron beam source 120, the electron beam energy control output 222a of the controller 222 is coupled to govern the output voltage level of the acceleration voltage supply 142 (and/or the discharge voltage supply 140).

Referring again to FIG. 12, the process begins after deposition or formation of a material to be etched (e.g., silicon dioxide) on a base layer (e.g., silicon) of a workpiece or wafer (block 821 of FIG. 12). The workpiece is placed in the chamber of an etch process reactor and a process gas is introduced into the chamber (block 822 of FIG. 12). An electron beam is directed into a process region of the chamber (block 824 of FIG. 12). An RF bias voltage is coupled to the workpiece (block 826). Then, the top-most atomic layer of the material to be etched is passivated (block 828). The passivation operation of block 828 consists of the following operations: set the electron beam energy to a value E(1) at which, predominantly, species that passivate the material to be etched are produced by dissociation and/or ionization of the process gas by the electron beam (block 831); set the ion energy at the workpiece surface to a level E(A) below the etch threshold of the deposited layer (block 832); and, activate or enable the remote plasma source (RPS) 410 (block 833) to generate more passivation species in the chamber. Then, upon the passivation reaching the bottom of the top atomic layer of the material to be etched, halt (block 834) the passivation operation and inactivate or disable the RPS 410 (block 835). Thereafter, the etching operation commences (block 836). The etching operation includes the following operations: set the electron beam energy to a value E(2) at which, predominantly, species that etch the material to be removed are produced by dissociation and ionization of the process gas by the electron beam (block 838); and, set the ion energy at the workpiece surface to a level E(B) above the etch threshold of the deposited material and below the etch threshold of the base layer (block 840). Then, upon etching through to the bottom of the top atomic layer of the deposited material, halt the etch operation (block 842) and repeat the entire process, starting with the passivation operation (block 834).

In another aspect, deposition on a workpiece is performed by performing blocks 722, 724, 730 and 732 of FIG. 2 using a process gas containing species to be deposited. In this alternative embodiment, the operation of block 732 is performed to set the ion energy to a level that promotes deposition. Also block 730 is performed to set the electron beam energy to a level favoring production (by dissociation and ionization) of deposition species from the process gas. The ion energy is controlled by tailoring the wave form of the RF bias power coupled to the workpiece, in the manner described above.

Advantages:

One advantage of the atomic layer etch process described above is that the time-consuming task of changing process gas with the etching of each atomic layer is eliminated. This is because the passivation and etching may be performed with the same process gas. An advantage is that ion energy control is very precise because the electron beam, while generating a plasma, does not contribute (or makes only a negligible contribution) to ion energy, leaving the control of ion energy to the RF bias power. A related advantage is that the waveform tailoring of the RF bias voltage (or current) coupled to the workpiece provides an accurate way of precisely setting ion energy within a narrow range centered at the desired energy level.

While the foregoing is directed to embodiments of the present invention, other and further embodiments of the invention may be devised without departing from the basic scope thereof, and the scope thereof is determined by the claims that follow.

What is claimed is:

1. A method of removing an overlying film comprising:
    generating a plasma in a chamber by providing an electron beam in said chamber;
    coupling an RF bias voltage to a workpiece in said chamber, said workpiece comprising said overlying film;
    performing a passivation process for a time duration corresponding to a desired thickness of a layer of said overlying film, said passivation process comprising:
        enabling flow of plasma by-products from a remote plasma source containing a passivating gas;
        setting energy of ions in said chamber to a first ion energy level less than a first minimum ion energy required for etching said overlying film;
    after said time duration, halting said passivation process and performing an etching process by:
        setting energy of ions in said chamber to a second ion energy level exceeding said first minimum ion energy.

2. The method of claim 1 wherein said workpiece comprises a base material under said overlying film, and said second ion energy level is less than a second minimum ion energy required to etch said base material.

3. The method of claim 2 wherein said overlying film comprises Silicon dioxide or Silicon nitride and said base material comprises crystalline Silicon.

4. The method of claim 1 wherein said desired thickness is one atomic layer.

5. The method of claim 1 wherein said passivation process is performed for a time duration sufficiently short to limit thickness of said layer to one atomic layer.

6. The method of claim 1 wherein said halting said passivation process comprises stopping said flow of plasma by-products from said remote plasma source to said reactor chamber.

7. The method of claim 1 wherein:
    said passivating gas contains Chlorine;
    said process gas comprises an etch species comprising a fluorocarbon.

8. The method of claim 1 wherein:
    said setting ion energy of ions to a first ion energy level comprises tailoring a time domain waveform of said RF bias voltage to an RF waveform in which the RF voltage is at a level corresponding to said first ion energy level for a duration of at least 50% of an RF cycle of said RF waveform.

9. The method of claim 1 wherein:
    said setting ion energy of ions to a second ion energy level comprises tailoring a time domain waveform of said RF bias voltage to an RF waveform in which the RF voltage is at a level corresponding to said second ion energy level for a duration of at least 50% of an RF cycle of said RF waveform.

10. A method of etching an overlying film, comprising:
generating a plasma in a chamber by directing an electron beam into said chamber;
coupling an RF bias voltage to a workpiece comprising said overlying film;
passivating a predetermined thickness of a layer of said overlying film by enabling flow of plasma by-products to said chamber and then disabling said flow of plasma by-products to said chamber;
etching said layer;
during said passivating, setting energy of ions in said chamber to a first ion energy level less than a first minimum ion energy for etching said layer by tailoring a time domain waveform of said RF bias voltage to an RF waveform in which the RF voltage is at a level corresponding to said first ion energy level for a duration of at least 50% of an RF cycle of said RF waveform;
during said etching, setting energy of ions in said chamber to a second ion energy level exceeding said first minimum ion energy by tailoring a time domain waveform of said RF bias voltage to an RF waveform in which the RF voltage is at a level corresponding to said second ion energy level for a duration of at least 50% of an RF cycle of said RF waveform.

11. The method of claim 10 further comprising:
limiting said passivating to a time duration corresponding to said predetermined thickness.

12. The method of claim 11 wherein said predetermined thickness corresponds to a predetermined number of atomic layers of said layer.

13. The method of claim 11 wherein said predetermined thickness corresponds to a single atomic layer.

14. The method of claim 10 further comprising repeating said passivating and etching in successive operations until removal of said overlying film is complete.

15. The method of claim 10 further comprising providing a process gas in said chamber, wherein said process gas comprises a precursor for an etchant species.

16. The method of claim 15 wherein said etchant species comprises a fluorocarbon.

17. The method of claim 10 further comprising producing said plasma by-products from a passivating gas, wherein said passivating gas comprises Chlorine.

18. The method of claim 10 wherein:
during said passivating, said tailoring comprises conforming a time domain waveform of said RF bias voltage to a shape that produces an ion energy distribution function having a population peak at said first ion energy level.

19. The method of claim 10 wherein:
during said etching, said tailoring comprises conforming a time domain waveform of said RF bias voltage to a shape that produces an ion energy distribution function having a population peak at said second ion energy level.

20. A method of performing atomic layer etching on a workpiece in alternating operations of passivating and etching in a chamber, comprising:
generating a plasma in said chamber by providing an electron beam in said chamber;
during said passivating, enabling a flow to said chamber of plasma by-products comprising passivation species from a remote plasma source, and tailoring RF bias power to a waveform in which RF voltage is at a level corresponding to a first ion energy level less than an etch threshold of a deposited layer on said workpiece for a duration of at least 50% of an RF cycle of said waveform; and
during said etching, halting said flow and tailoring RF bias power to a waveform in which RF voltage is at a level corresponding to a second ion energy level exceeding an etch threshold of a deposited layer on said workpiece for a duration of at least 50% of an RF cycle of said waveform.

* * * * *